United States Patent
Cheng

(10) Patent No.: US 10,756,235 B2
(45) Date of Patent: Aug. 25, 2020

(54) STRIPPED METHOD FOR PREPARING SEMICONDUCTOR STRUCTURE

(71) Applicant: ENKRIS SEMICONDUCTOR, INC, Jiangsu (CN)

(72) Inventor: Kai Cheng, Jiangsu (CN)

(73) Assignee: ENKRIS SEMICONDUCTOR, INC, Jiangsu (CN)

( * ) Notice: Subject to any disclaimer, the term of this patent is extended or adjusted under 35 U.S.C. 154(b) by 73 days.

(21) Appl. No.: 16/099,165

(22) PCT Filed: Mar. 9, 2017

(86) PCT No.: PCT/CN2017/076113
§ 371 (c)(1),
(2) Date: Nov. 5, 2018

(87) PCT Pub. No.: WO2018/161300
PCT Pub. Date: Sep. 13, 2018

(65) Prior Publication Data
US 2019/0157500 A1    May 23, 2019

(51) Int. Cl.
*H01L 33/00* (2010.01)
*H01L 21/78* (2006.01)
*H01L 21/76* (2006.01)
*H01L 21/02* (2006.01)
*H01L 33/12* (2010.01)

(52) U.S. Cl.
CPC .... *H01L 33/0093* (2020.05); *H01L 21/02002* (2013.01); *H01L 21/02458* (2013.01); *H01L 21/76* (2013.01); *H01L 21/7813* (2013.01); *H01L 33/12* (2013.01)

(58) Field of Classification Search
CPC . H01L 21/7806–7813; H01L 21/02458; H01L 33/0093
See application file for complete search history.

(56) References Cited

U.S. PATENT DOCUMENTS

2011/0177631 A1    7/2011    Gardner et al.

FOREIGN PATENT DOCUMENTS

| CN | 102169959 A | 8/2011 |
|---|---|---|
| CN | 103078017 A | 5/2013 |
| CN | 105591004 A | 5/2016 |
| CN | 105765710 A | 7/2016 |

OTHER PUBLICATIONS

ISA/CN, International Search Report dated Dec. 5, 2017 in International Application No. PCT/CN2017/076113, total 3 pages.
ISA/CN, Written Opinion of the International Searching Authority dated Dec. 5, 2017 in International Application No. PCT/CN2017/076113, total 3 pages.

*Primary Examiner* — Amar Movva
(74) *Attorney, Agent, or Firm* — Masuvalley & Partners

(57) ABSTRACT

A method of forming a semiconductor structure is provided. The method includes providing a substrate with a first melting point. A sacrificial layer with a second melting point is forming over the substrate. The second melting point is less than the first melting point. A stack of semiconductor layers is formed over the sacrificial layer. The stack of semiconductor layers has a third melting point greater than the second melting point and a formation temperature less than the second melting point. A thermal process is performed at a temperature greater than the second melting point and less than the first melting point and the third melting point in order to melt the sacrificial layer such that the substrate is stripped from the stack of semiconductor layers.

14 Claims, 8 Drawing Sheets

STRIPPED METHOD FOR PREPARING SEMICONDUCTOR STRUCTURE

FIELD OF THE DISCLOSURE

The present disclosure relates to a semiconductor technology, and in particular, to a fabrication of a semiconductor structure using a stripped method.

DESCRIPTION OF THE RELATED ART

The nitride based semiconductor materials have many advantages on electrical, physical and chemical properties, such as wide band gaps, high electron mobility, high breakdown voltage, and excellent chemical stability. Therefore, these materials are particularly suited for use in the fabrication of light-emitting diodes (LEDs), photodetectors (PDs), heterojunction field effect transistors (HFETs), or high electron mobility transistors (HEMTs).

The nitride based semiconductor materials typically require hetroepitaxial growth of GaN layers on a different substrate, such as sapphire ($Al_2O_3$), silicon carbide (SiC), or silicon (Si). For example, the GaN layers may be epitaxially grown onto the sapphire, silicon carbide, or silicon substrate by metal-organic chemical vapor deposition (MOCVD), hydride vapor phase epitaxy (HVPE), liquid phase epitaxy (LPE), molecular beam epitaxy (MBE), or the like.

However, these methods of growth on substrates have constraints on the GaN layer quality. For example, large lattices and thermal-expansion coefficient mismatching between the GaN layer and the sapphire substrate may result in high density of defects (e.g., dislocations) at the interface between the GaN layer and the sapphire substrate. Moreover, the sapphire substrate has a poor thermal conductivity which adversely impacts performance of opto-electronic devices. In addition, the sapphire substrate is an insulator and is not suitable for forming devices with vertical structures.

Comparing the silicon carbide substrate with the sapphire substrate, the silicon carbide substrate has a smaller lattice mismatch and better thermal properties and electric conductivity than the sapphire substrate. However, high cost and small substrate size for the silicon carbide substrate still need to be addressed.

Since a high density of dislocations degrades the preparation and operation of opto-electronic devices, freestanding bulk GaN materials are preferred. Thick GaN can be grown on sapphire substrates and then many substrate separation approaches including wet etching, chemical mechanical polishing (CMP), or laser lift-off (LLO) have been developed to remove sapphire substrates and fabricate the freestanding bulk GaN. Laser lift-off technology is commonly used to strip the sapphire substrate from the GaN layer. However, this technology is expensive and may introduce thermal stress into the GaN layer and damage the interface between the sapphire substrate and the GaN layer. Thus, it is tricky to move to large wafers size (>4 inch).

Therefore, there is a need to develop a method for forming a group-III film structure that is capable of addressing or mitigating the problems described above.

SUMMARY

In some embodiments of the disclosure, a method for forming a semiconductor structure is provided. The method includes providing a substrate with a first melting point. A sacrificial layer with a second melting point is formed over the substrate by deposition or wafer bonding. The second melting point is less than the first melting point. A stack of semiconductor layers is formed over the sacrificial layer. The stack of semiconductor layers has a third melting point greater than the second melting point and a formation temperature less than the second melting point. The substrate is stripped from the stack of semiconductor layers by melting the sacrificial layer through performing a thermal process at a temperature greater than the second melting point and less than the first melting point and the third melting point.

In some embodiments of the disclosure, a method for forming a group-III film structure is provided. The method includes providing a silicon substrate. A sacrificial layer is formed over the substrate by deposition or wafer bonding. The sacrificial layer has a melting point less than that of the silicon substrate. A silicon layer is formed over the sacrificial layer by deposition or wafer bonding. A stack of group-III nitride layers is formed over the silicon layer. The stack of group-III nitride layers has a melting point greater than that of the sacrificial layer and a formation temperature less than that of the sacrificial layer. The silicon substrate is stripped from the stack of group-III nitride layers by melting the sacrificial layer through performing a thermal process at a temperature greater than the melting point of the sacrificial layer and less than the melting point of the silicon substrate and the melting point of the stack of group-III nitride layers.

BRIEF DESCRIPTION OF THE DRAWINGS

The present disclosure can be further understood by reading the subsequent detailed description and examples with references made to the accompanying drawings, wherein:

FIG. 1E-1 is a cross-sectional view of a semiconductor device according to some embodiments of the present disclosure.

DETAILED DESCRIPTION

Figure 1A:
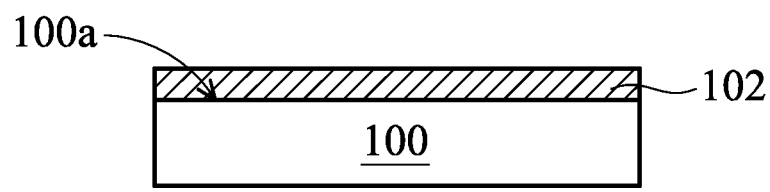
FIGS. 1A to 1E are cross-sectional views of various stages of a method of forming a semiconductor device according to some embodiments of the present disclosure.

The following description is of the best-contemplated mode of carrying out the disclosure. This description is made for the purpose of illustrating the general principles of the disclosure and should not be taken in a limiting sense. These are, of course, merely examples and are not intended to be limited. In addition, the disclosure may repeat reference numerals and/or letters in the various examples. This repetition is for the purpose of simplicity and clarity and does not in itself dictate a relationship between the various embodiments and/or configurations discussed.

Some embodiments of the disclosure are described. FIGS. 1A to 1E are cross-sectional views of various stages of a method of forming a semiconductor device in accordance with some embodiments. Additional operation steps can be provided before, during, and/or after the stages described in FIGS. 1A to 1E. Moreover, in different embodiments, some of the stages that are described in FIGS. 1A to 1E can be replaced or eliminated. In some embodiments, the semiconductor device is implemented as a light-emitting device.

As shown in FIG. 1A, a substrate 100 is provided, in accordance with some embodiments. The substrate 100 is formed of a material that is suitable for growing an epitaxial structure including semiconductor materials. For example, the semiconductor materials may include group III-V compound materials, such as gallium nitride (GaN), aluminum nitride (AlN), aluminum gallium nitride (AlGaN), aluminum gallium indium nitride (AlGaInN), or a combination thereof. In some embodiments, the substrate 100 may be formed of sapphire or silicon carbide. In some embodiments, the substrate 100 may be formed of silicon. In these cases, the substrate 100 may be a silicon (100), silicon (111), or silicon (110) substrate. The substrate 100 made of silicon is easy to process and is more economical compared to the substrate made of sapphire or silicon carbide.

Afterwards, a sacrificial layer 102 is formed over a surface 100a of the substrate 100 by deposition or wafer bonding, in accordance with some embodiments. In some embodiments, the sacrificial layer 102 is sometimes referred to as a lift-off layer. Moreover, the sacrificial layer 102 is formed of a material that has a different melting point from those of the materials for forming the substrate 100 and group III-V semiconductor materials, such that the lift-off layer (i.e., the sacrificial layer 102) can be selectively removed by a thermal process or a heat treatment.

In some embodiments, the substrate 100 has a first melting point and the sacrificial layer 102 over the substrate 100 has a second melting point. Moreover, the second melting point is less than the first melting point. For example, the substrate 100 may be formed of silicon and the first melting point is about 1410° C. In these cases, the sacrificial layer 102 may be formed of silicon compound. The silicon compound is made of silicon and an element which has a melting point less than that of silicon. For example, the silicon compound is silicon-germanium ($Si_{1-x}Ge_x$) which has the second melting point greater than the melting point of the germanium (i.e., about 938° C.) and less than the first melting point of the substrate 100 (i.e., about 1410° C.).

The melting point of the silicon-germanium ($Si_{1-x}Ge_x$) may be varied by adjusting the weight percent (x %) of germanium. Namely, the second melting point of the sacrificial layer 102, which is formed of silicon-germanium ($Si_{1-x}Ge_x$), is reduced from 1410° C. when the weight percent (x %) of germanium is increased. For example, when the weight percent (x %) of germanium is 20%, the second melting point of the sacrificial layer 102 is about 1254° C. In some embodiments, a weight percent (x %) of germanium in the sacrificial layer 102 is in a range of about 1% to 99%.

As still shown in FIG. 1A, in some embodiments, the surface 100a of the substrate 100 is doped during the growth of the substrate 100, so as to form the sacrificial layer 102 that is formed of silicon-germanium ($Si_{1-x}Ge_x$) on the substrate 100. In these cases, the process for fabrication of the semiconductor device can be simplified. In other embodiments, the sacrificial layer 102 that is formed of silicon-germanium ($Si_{1-x}Ge_x$) is formed over the surface 100a of the substrate 100 by selective epitaxial growth (SEG), low pressure chemical vapor deposition (LPCVD) process, rapid thermal chemical vapor deposition (RTCVD) process, or another suitable deposition process. For example, the silicon-germanium ($Si_{1-x}Ge_x$) may be formed by a CVD process using silicon precursors, germanium precursors and carrier gases under a variety of pressures, flow rates and temperatures. In these cases, silicon precursors may include silane, disilane, trisilane, dichlorosilane, trichlorosilaneor and tetrachlorosilane. Moreover, germanium precursors may include $GeH_4$ and digermane. It will be apparent to one of skill in the art that other silicon and germanium precursors may be used for formation of silicon-germanium ($Si_{1-x}Ge_x$).

Figure 1B:
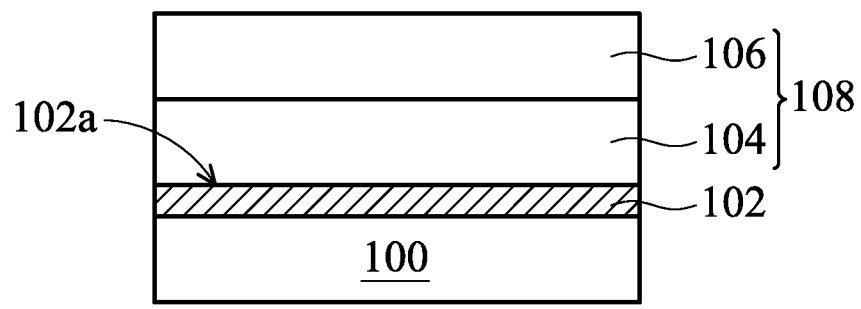

As shown in FIG. 1B, a stack of semiconductor layers 108 is formed over the surface 102a of the sacrificial layer 102, in accordance with some embodiments, so that the sacrificial layer 102 is interposed between the substrate 100 and the stack of semiconductor layers 108. In some embodiments, the stack of semiconductor layers 108 includes group-III nitride materials, such as GaN, AlGaN, AlGaInN, or a combination thereof. In these cases, the stack of semiconductor layers 108 has a third melting point that is greater than the second melting point of the sacrificial layer 102. In some embodiments, the stack of semiconductor layers 108 has a formation temperature less than the second melting point of the sacrificial layer 102. Moreover, the third melting point of the stack of semiconductor layers 108 is greater than the first melting point of the substrate 100.

In some embodiments, the stack of semiconductor layers 108 includes a first semiconductor layer 104 that is grown over the surface 102a of the sacrificial layer 102 and a second semiconductor layer 106 that is grown over the top of the first semiconductor layer 104. For example, the first semiconductor layer 104 may include a group-III nitride layer with a first conductivity type (e.g., an n-type GaN layer) and the second semiconductor layer 106 may include a group-III nitride layer with a second conductivity type (e.g., a p-type GaN layer). Alternatively, the first semiconductor layer 104 may include a p-type GaN layer and the second semiconductor layer 106 may include an n-type GaN layer.

In some embodiments, the first semiconductor layer 104 and the second semiconductor layer 106 are successively deposited over the surface 102a of the sacrificial layer 102 by MOCVD, HVPE, LPE, MBE, metal organic VPE (MOVPE), plasma-enhanced CVD (PECVD), or the like. The first semiconductor layer 104 and the second semiconductor layer 106 may have different thicknesses that are based on the device being fabricated.

In some embodiments, the stack of semiconductor layers 108 further includes an active layer (not shown) interposed between the first semiconductor layer 104 and the second semiconductor layer 106 to form an LED structure. In the LED structure, electrons and holes are injected into the active layer when a bias is applied across the stack of semiconductor layers 108. The electrons and holes recombine in this active layer to generate light. In some embodiments, the active layer is a group III-V nitride quantum well active layer, such as an InGaN quantum well active layer.

In some embodiments, the stack of semiconductor layers 108 including the first semiconductor layer 104 and the second semiconductor layer 106 with different conductivity types may be implemented as a PN diode structure.

In some embodiments, the first semiconductor layer 104 of the stack of semiconductor layers 108 may include an undoped semiconductor material (e.g., GaN, AlGaN, InGaN, InAlGaN or the like) and the second semiconductor layer 106 of the stack of semiconductor layers 108 may include a doped semiconductor material (e.g., GaN, AlGaN, InGaN, InAlGaN or the like). In these cases, the stack of semiconductor layers 108 may be employed to form an HEMT structure, in which the first semiconductor layer 104 serves as a channel layer of the HEMT and the second semiconductor layer 106 serves as a barrier layer of the HEMT. These semiconductor layers 104 and 106 on the GaN buffer layer form a semiconductor hetrojunction structure and cause polarization to include a conductive two dimensional electron gas (2DEG) region near the junction of these semiconductor layers 104 and 106.

In some embodiments, the stack of semiconductor layers 108 further includes a nucleation layer (not shown) and an overlying buffer layer (not shown). In some embodiments, the nucleation layer may include GaN, AlN, or AlGaN. Moreover, the buffer layer on the top of the nucleation layer may include GaN, AlN, or AlGaN.

Figure 1C:
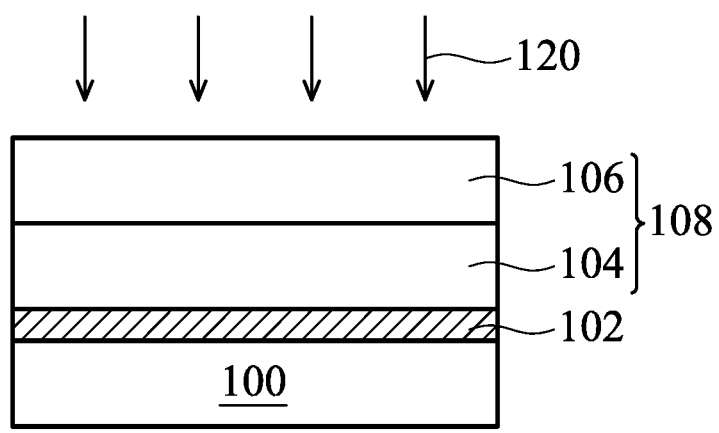
Figure 1D:
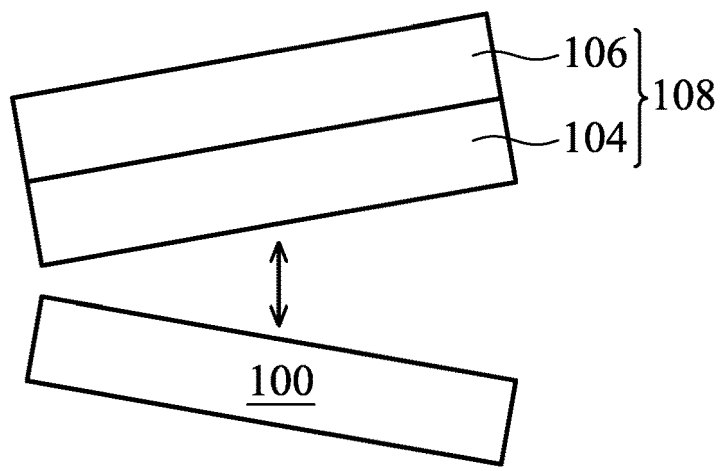

As shown in FIG. 1C, a thermal process 120 or heat treatment is performed on the structure shown in FIG. 1B, in accordance with some embodiments. In some embodiments, in order to melt the sacrificial layer 102, the thermal process 120 or heat treatment is performed at a temperature greater than the second melting point of the sacrificial layer 102 and less than the first melting point of the substrate 100 and the third melting point of the stack of semiconductor layers 108. As a result, the substrate 100 is stripped from the stack of semiconductor layers 108, as shown in FIG. 1D. In an example, the sacrificial layer 102 is formed of $Si_{0.8}Ge_{0.2}$, and the thermal process 120 or heat treatment is performed at a temperature greater than 1254° C. and less than 1410° C.

Figure 1E:
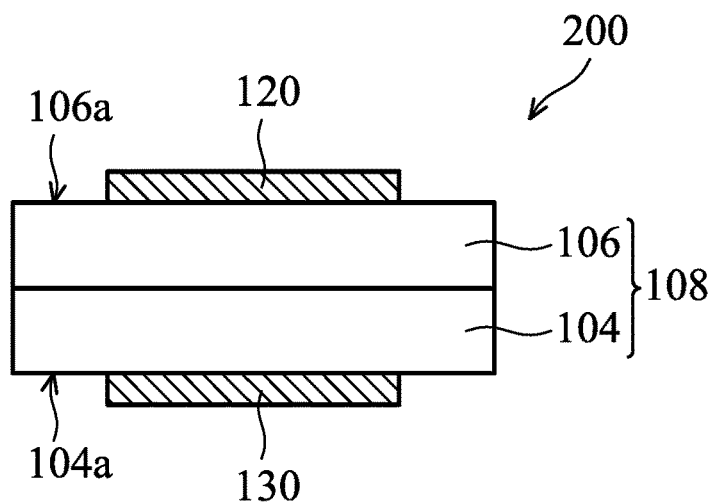

After the substrate 100 is removed from the stack of semiconductor layers 108, a first electrode layer 130 and a second electrode layer 120 are respectively formed on opposing sides of the stack of semiconductor layers 108, in accordance with some embodiments, as shown in FIG. 1E. For example, the first electrode layer 130 is formed over a top surface 104a of the first semiconductor layer 104 and the second electrode layer 120 is formed over a top surface 106a of the second semiconductor layer 106. In some embodiments, the first semiconductor layer 104 is n-type and the second semiconductor layer 106 is p-type. In these cases, the first electrode layer 130 may include aluminum (Al), titanium (Ti), or a combination thereof or another suitable metal material. Moreover, the second electrode layer 120 may include gold (Au), nickel (Ni), or a combination thereof or another suitable metal material.

Alternatively, the first semiconductor layer 104 is p-type and the second group-III semiconductor layer 106 is n-type. In these cases, the first electrode layer 130 may include gold (Au), nickel (Ni), or a combination thereof or another suitable metal material. Moreover, the second electrode layer 120 may include aluminum (Al), titanium (Ti), or a combination thereof or another suitable metal material.

The first electrode layer 130 and the second electrode layer 120 may serve as contact layers for the semiconductor device (e.g., a light-emitting device) 200 and may be respectively formed by a sputtering process, physical vapor deposition (PVD) process, or another suitable deposition process. After formation of the first electrode layer 130 and the second electrode layer 120, the fabrication of the semiconductor device 200 is completed.

Figures 1, 1E:
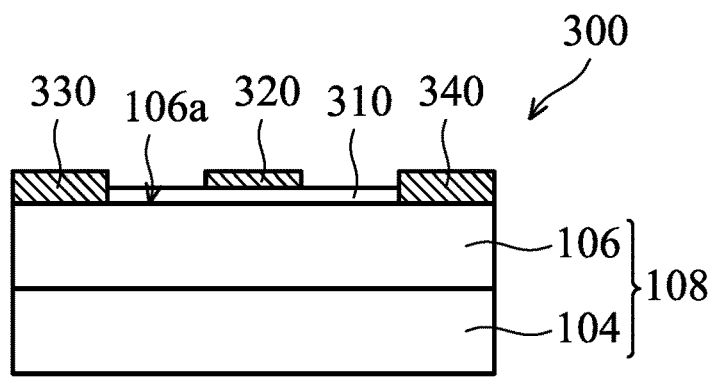

In some embodiments, after the substrate 100 is removed from the stack of semiconductor layers 108, a dielectric layer and electrode layers are formed on the top of the stack of semiconductor layers 108. As shown in FIG. 1E-1, for example, a dielectric layer 310 is formed on the top surface 106a of the second semiconductor layer 106. The dielectric layer 310 may serve as a gate dielectric layer of an HEMT and include SiN, SiCN, $SiO_2$, SiAlN, $Al_2O_3$, AlON, SiON, $HfO_2$, HfAlO, or a combination thereof. In some embodiments, the dielectric layer 310 may be formed by a deposition process, such as a CVD process.

Moreover, a gate electrode layer 320 of an HEMT is formed on the dielectric layer 310 and the source electrode layer 330 and the drain electrode layer 340 of an HEMT are respectively formed on the top surface 106a of the second semiconductor layer 106 and on both sides of the gate electrode layer 320. The electrode layers 310, 330, and 340 may be formed of a conductive material, such as metal (e.g., Al, Au, Ni, Ti, tantalum (Ta), tungsten (W), or a combination thereof) or another suitable electrode material. The electrode layers 310, 330, and 340 may be respectively formed by a sputtering process, PVD process, or another suitable deposition process.

After formation of the dielectric layer 310 and the electrode layers 310, 330, and 340, the fabrication of the semiconductor device (e.g., an HEMT) 300 is completed.

FIGS. 2A to 2E are cross-sectional views of various stages of a method of forming a semiconductor device in accordance with some embodiments. Additional operation steps can be provided before, during, and/or after the stages described in FIGS. 2A to 2E. Moreover, in different embodiments, some of the stages that are described in FIGS. 2A to 2E can be replaced or eliminated. Additionally, elements in FIGS. 2A to 2E that are the same as or similar to those in FIGS. 1A to 1E are labeled with the same reference numbers as in FIGS. 1A to 1E and are not described again, for brevity. In some embodiments, the semiconductor device is implemented as a light-emitting device.

Figure 2A:
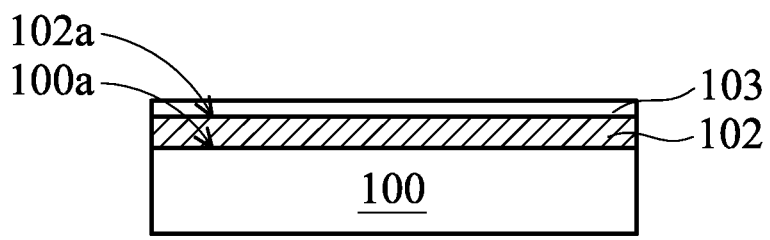
FIGS. 2A to 2E are cross-sectional views of various stages of a method of forming a semiconductor device according to some embodiments of the present disclosure.

As shown in FIG. 2A, a structure that is the same as that shown in FIG. 1A is provided, in accordance with some embodiments. Afterwards, a protective layer 103 is formed over the sacrificial layer 102 by deposition or wafer bonding, in accordance with some embodiments. In some embodiments, the sacrificial layer 102 is formed of silicon-germanium ($Si_{1-x}Ge_x$). In these cases, the protective layer 103 may prevent the germanium atoms in the sacrificial layer 102 from diffusing into the subsequently formed semiconductor structure (e.g., a stack of semiconductor layers 108 shown in FIG. 2B). The diffusion of germanium atoms may adversely impact the quality of the epitaxial structure, so as to degrade performance of the device including the epitaxial structure.

In some embodiments, the protective layer 103 has a fourth melting point that is greater than the second melting point of the sacrificial layer 102 or equal to the first melting point of the substrate 100. For example, both the substrate 100 and the protective layer 103 may be formed of silicon so that the fourth melting point of the protective layer 103 is equal to the first melting point of the substrate 100. In this case, the protective layer 103 may be a silicon (111) layer and formed by, for example, an epitaxial growth process and the fourth melting point of the protective layer 103 is less than the third melting point of the subsequently formed semiconductor structure (e.g., the stack of semiconductor layers 108 shown in FIG. 2B). In some embodiments, the protective layer 103 may be formed of silicon carbide (SiC) or sapphire ($Al_2O_3$) and formed by wafer bonding. In some embodiments, the protective layer 103 also serves as a sacrificial layer that has a thickness not greater than 10 µm.

Figure 2B:
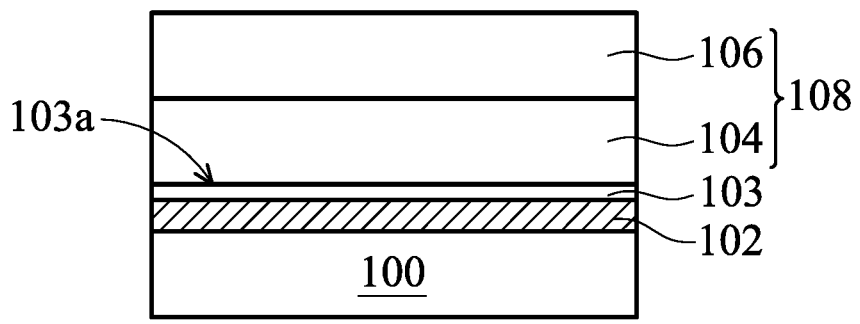

As shown in FIG. 2B, the stack of semiconductor layers 108 is formed over the surface 103a of the protective layer 103, in accordance with some embodiments, so that the sacrificial layer 102 and the overlying protective layer 103 are interposed between the substrate 100 and the stack of semiconductor layers 108.

Figure 2C:
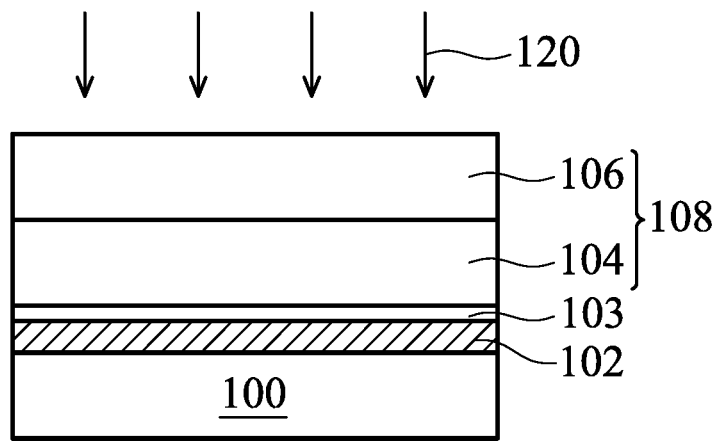
Figure 2D:
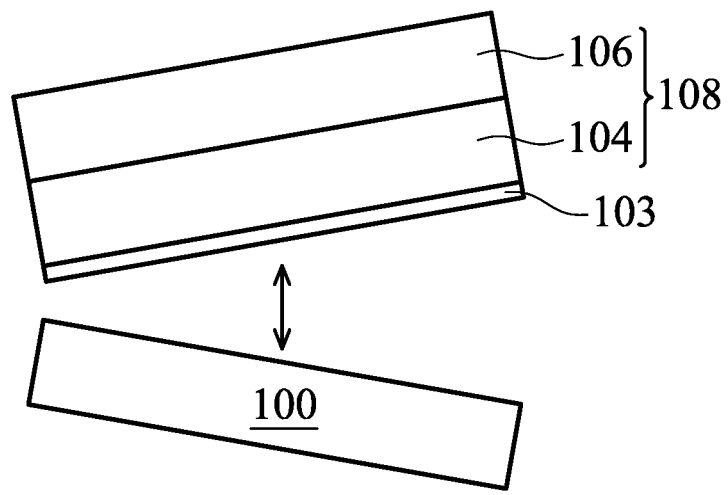

As shown in FIG. 2C, a thermal process 120 or a heat treatment is performed on the structure shown in FIG. 2B in order to melt the sacrificial layer 102, in accordance with some embodiments. As a result, the substrate 100 is stripped from the stack of semiconductor layers 108 having the protective layer 103 thereon, as shown in FIG. 2D.

Figure 2E:
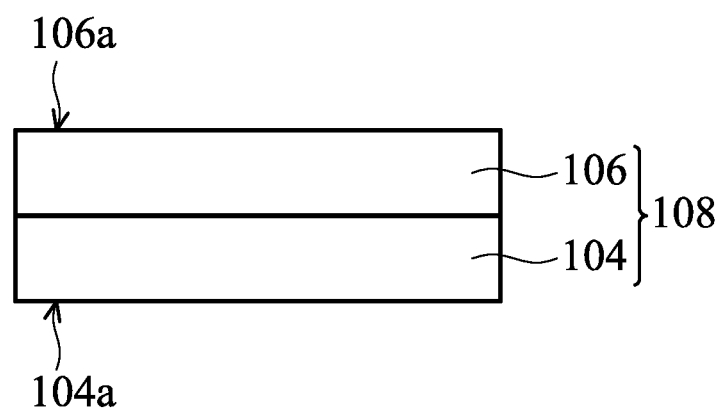

As shown in FIG. 2E, the protective layer 103 is removed, in accordance with some embodiments. In some embodiments, after the substrate 100 is removed from the stack of semiconductor layers 108 having the protective layer 103 thereon, the protective layer 103 is removed by a wet etching process or a polishing process, such as chemical mechanical polishing (CMP).

Similarly, a first electrode layer 130 and a second electrode layer 120, as shown in FIG. 1E, may be respectively formed on opposing sides of the stack of semiconductor layers 108, in accordance with some embodiments. After formation of the first electrode layer 130 and the second electrode layer 120, the fabrication of the semiconductor device (e.g., the light-emitting device) is completed. Alternatively, a dielectric layer 310 (as shown in FIG. 1E-1) may be formed on the top surface 106a of the second semiconductor layer 106, a gate electrode layer 320 (as shown in FIG. 1E-1) may be formed on the dielectric layer 310, and the source electrode layer 330 and the drain electrode layer 340 (as shown in FIG. 1E-1) may be respectively formed on the top surface 106a of the second semiconductor layer 106 and on both sides of the gate electrode layer 320. After formation of the dielectric layer 310, and the electrode layers 310, 330, and 340, the fabrication of the semiconductor device (e.g., the HEMT) is completed.

FIGS. 3A to 3E are cross-sectional views of various stages of a method of forming a semiconductor device in accordance with some embodiments. Additional operation steps can be provided before, during, and/or after the stages described in FIGS. 3A to 3E. Moreover, in different embodiments, some of the stages that are described in FIGS. 3A to 3E can be replaced or eliminated. Additionally, elements in FIGS. 3A to 3E that are the same as or similar to those in FIGS. 1A to 1E or 2A to 2E are labeled with the same reference numbers as in FIGS. 1A to 1E or 2A to 2E and are not described again, for brevity. In some embodiments, the semiconductor device is implemented as a light-emitting device.

Figure 3A:
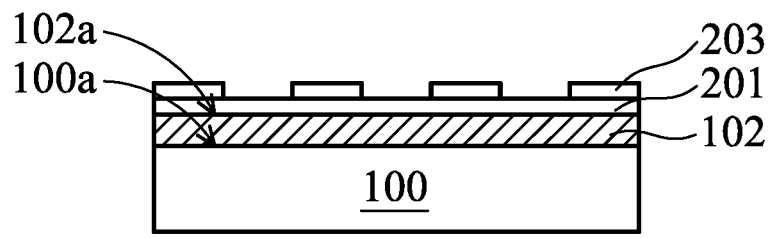
FIGS. 3A to 3E are cross-sectional views of various stages of a method of forming a semiconductor device according to some embodiments of the present disclosure.

As shown in FIG. 3A, a structure that is the same as that shown in FIG. 1A is provided, in accordance with some embodiments. Afterwards, an insulating layer 201 is formed over the sacrificial layer 102. In some embodiments, the insulating layer 201 is formed of silicon oxide ($SiO_2$). In these cases, the insulating layer 201 may be formed over the sacrificial layer 102 by deposition, such as CVD. After the insulating layer 201 is formed, a protective layer (not shown) is formed over the insulating layer 201 by deposition or wafer bonding, in accordance with some embodiments. In these cases, the material and the formation of protective layer may be the same as or similar to these of the protective layer 103 shown in FIG. 2A. The insulating layer 201 and the protective layer prevent the germanium atoms in the sacrificial layer 102 from diffusing into the subsequently formed semiconductor structure (e.g., a stack of semiconductor layers 108 shown in FIG. 3B).

Afterwards, the protective layer may be patterned by an etching process using the insulating layer 201 as a stop layer, so as to expose portions of the insulating layer 201. As shown in FIG. 3A, the patterned protective layer 203 may increase the quality of the subsequently formed semiconductor structure (e.g., a stack of semiconductor layers 108 shown in FIG. 3B). Moreover, the patterned protective layer 203 may serve as a stress buffer to release the stress from the subsequently formed semiconductor structure. In some embodiments, the patterned protective layer 203 also serves as a sacrificial layer that has a thickness not greater than 10 µm.

Figure 3B:
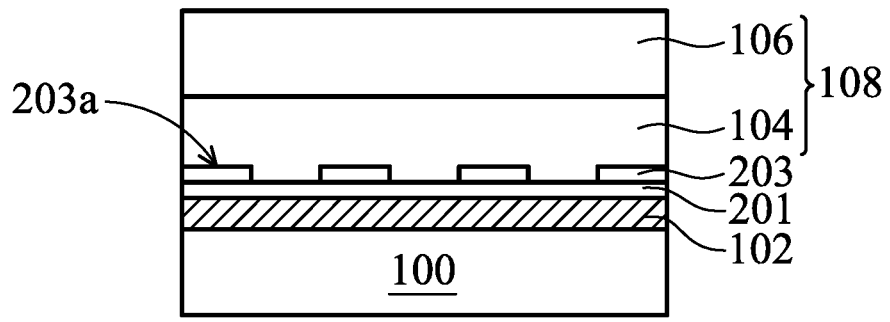

As shown in FIG. 3B, a stack of semiconductor layers 108 is formed over the surface 203a of the patterned protective layer 203 and the portions of the insulating layer 201 exposed from the patterned protective layer 203, in accordance with some embodiments, so that the sacrificial layer 102 and the overlying insulating layer 201 and patterned protective layer 203 are interposed between the substrate 100 and the stack of semiconductor layers 108.

Figure 3C:
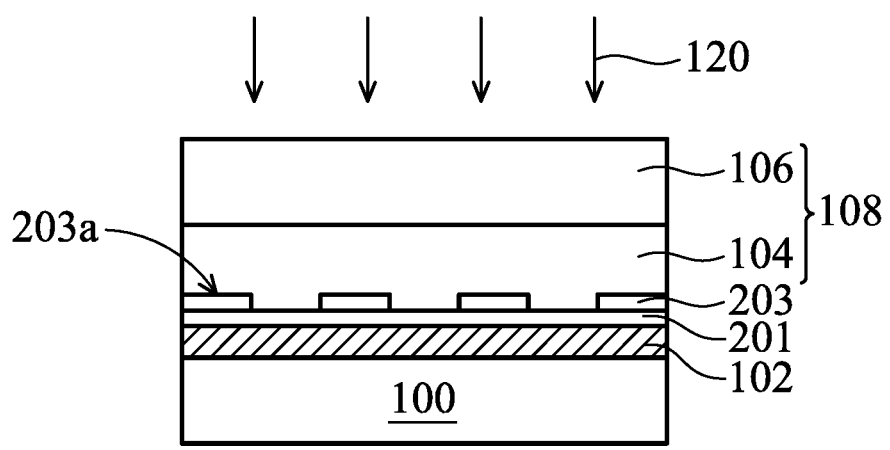
Figure 3D:
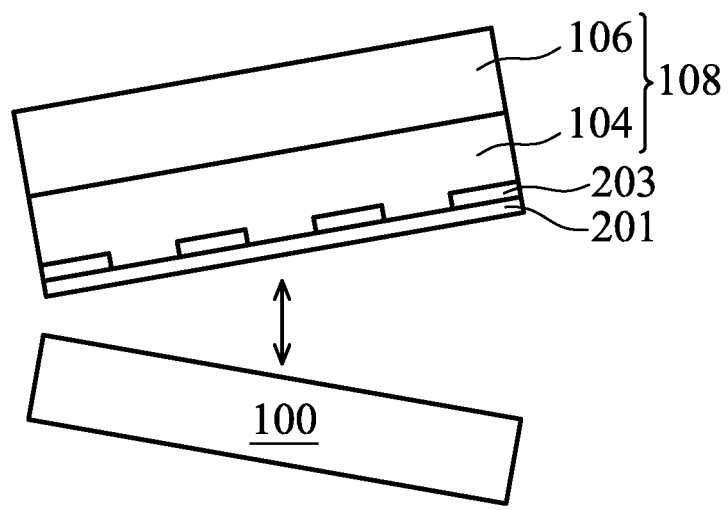

As shown in FIG. 3C, a thermal process 120 or a heat treatment is performed on the structure shown in FIG. 3B in order to melt the sacrificial layer 102, in accordance with some embodiments. As a result, the substrate 100 is stripped from the stack of semiconductor layers 108 having the insulating layer 201 and the patterned protective layer 203 thereon, as shown in FIG. 3D.

Figure 3E:
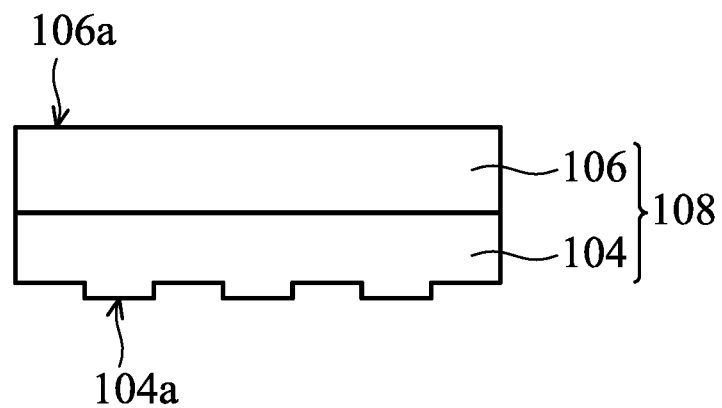

As shown in FIG. 3E, the insulating layer 201 and the patterned protective layer 203 are successively removed, in accordance with some embodiments. In some embodiments, after the substrate 100 is removed from the stack of semiconductor layers 108 having the insulating layer 201 and the patterned protective layer 203 thereon, the insulating layer 201 and the patterned protective layer 203 may be removed by an etching process, a polishing process (such as chemical mechanical polishing (CMP)) or a combination thereof.

Similarly, a first electrode layer 130 and a second electrode layer 120, as shown in FIG. 1E, may be respectively formed on opposing sides of the stack of semiconductor layers 108, in accordance with some embodiments. After formation of the first electrode layer 130 and the second electrode layer 120, the fabrication of the semiconductor device (e.g., the light-emitting device) is completed. Alternatively, a dielectric layer 310 (as shown in FIG. 1E-1) may be formed on the top surface 106a of the second semiconductor layer 106, a gate electrode layer 320 (as shown in FIG. 1E-1) may be formed on the dielectric layer 310, and the source electrode layer 330 and the drain electrode layer 340 (as shown in FIG. 1E-1) may be respectively formed on the top surface 106a of the second semiconductor layer 106 and on both sides of the gate electrode layer 320. After formation of the dielectric layer 310, and the electrode layers 310, 330, and 340, the fabrication of the semiconductor device (e.g., the HEMT) is completed.

FIGS. 4A to 4D are cross-sectional views of various stages of a method of forming a semiconductor device in accordance with some embodiments. Additional operation steps can be provided before, during, and/or after the stages described in FIGS. 4A to 4D. Moreover, in different embodiments, some of the stages that are described in FIGS. 4A to 4D can be replaced or eliminated. Additionally, elements in FIGS. 4A to 4D that are the same as or similar to those in FIGS. 3A to 3E are labeled with the same reference numbers as in FIGS. 3A to 3E and are not described again, for brevity. In some embodiments, the semiconductor device is implemented as a light-emitting device.

Figure 4A:
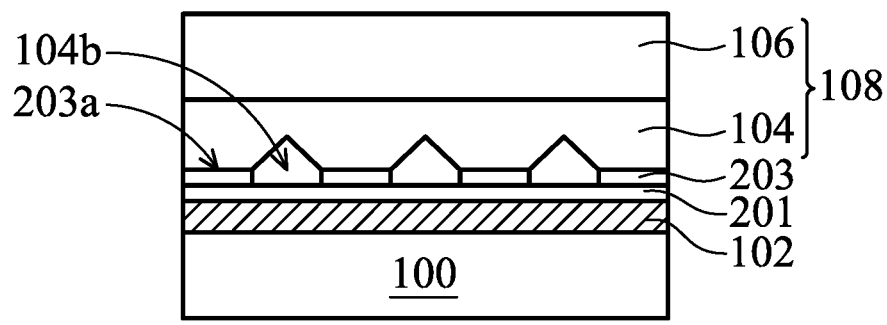
FIGS. 4A to 4D are cross-sectional views of various stages of a method of forming a semiconductor device according to some embodiments of the present disclosure.

As shown in FIG. 4A, a structure that is the same as that shown in FIG. 3A is provided, in accordance with some embodiments. Afterwards, a stack of semiconductor layers 108 is formed over the surface 203a of the patterned protective layer 203 by selective epitaxial growth (SEG), in accordance with some embodiments, so that the sacrificial layer 102 and the overlying insulating layer 201 and patterned protective layer 203 are interposed between the substrate 100 and the stack of semiconductor layers 108.

After the selective epitaxial growth process is performed, voids 104 are formed in the patterned protective layer 203 and the first semiconductor layer 104 of the stack of semiconductor layers 108.

Figure 4B:
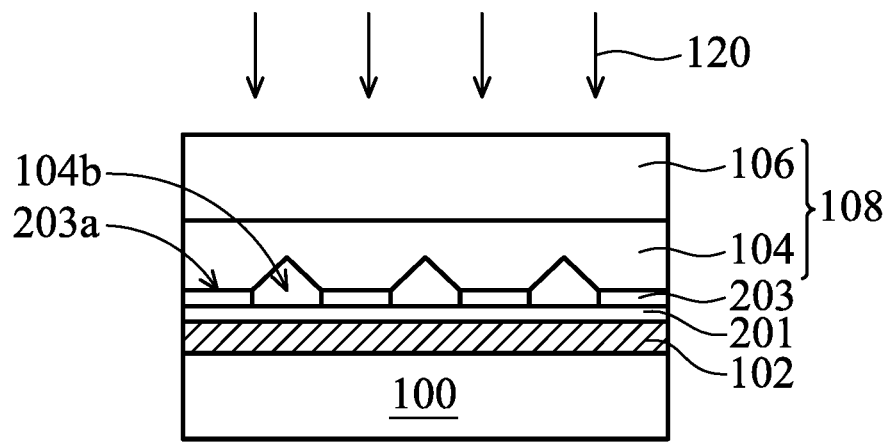
Figure 4C:
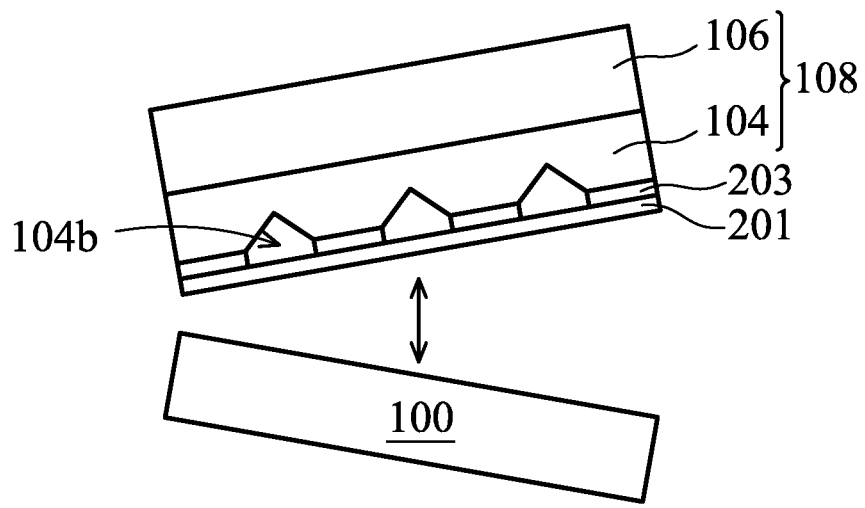

As shown in FIG. 4B, a thermal process 120 or a heat treatment is performed on the structure shown in FIG. 4A in order to melt the sacrificial layer 102, in accordance with some embodiments. As a result, the substrate 100 is stripped from the stack of semiconductor layers 108 having the insulating layer 201 and the patterned protective layer 203 thereon, as shown in FIG. 4C.

Figure 4D:
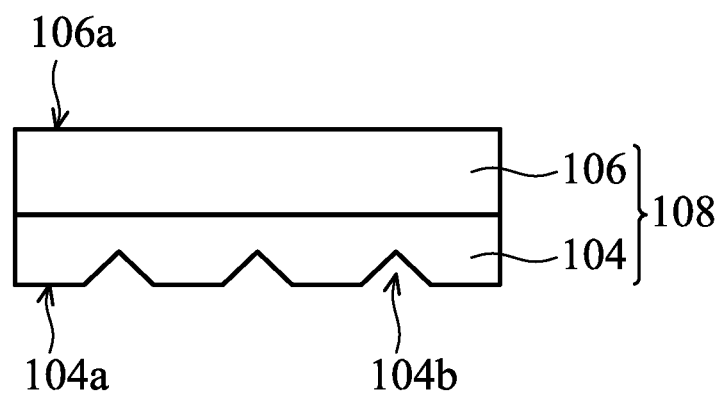

As shown in FIG. 4D, the insulating layer 201 and the patterned protective layer 203 are successively removed, in accordance with some embodiments. In some embodiments, after the substrate 100 is removed from the stack of semiconductor layers 108 having the insulating layer 201 and the patterned protective layer 203 thereon, the insulating layer 201 and the patterned protective layer 203 may be removed by an etching process, a polishing process (such as chemical mechanical polishing (CMP)) or a combination thereof.

Similarly, a first electrode layer 130 and a second electrode layer 120, as shown in FIG. 1E, may be respectively formed on opposing sides of the stack of semiconductor layers 108, in accordance with some embodiments. After formation of the first electrode layer 130 and the second electrode layer 120, the fabrication of the semiconductor device (e.g., the light-emitting device) is completed. Alternatively, a dielectric layer 310 (as shown in FIG. 1E-1) may be formed on the top surface 106a of the second semiconductor layer 106, a gate electrode layer 320 (as shown in FIG. 1E-1) may be formed on the dielectric layer 310, and the source electrode layer 330 and the drain electrode layer 340 (as shown in FIG. 1E-1) may be respectively formed on the top surface 106a of the second semiconductor layer 106 and on both sides of the gate electrode layer 320. After formation of the dielectric layer 310, and the electrode layers 310, 330, and 340, the fabrication of the semiconductor device (e.g., the HEMT) is completed.

According to the foregoing embodiments, since a semiconductor structure is separated or stripped from the substrate by a thermal process, rather than a laser lift-off process, the manufacturing cost can be effectively reduced. Moreover, the thermal stress introduced by the laser lift-off process and the surface damage of the semiconductor structure due to the laser lift-off process can be prevented, thereby increasing the quality of the semiconductor structure. As a result, reliability and performance of the semiconductor device, including the semiconductor structure, can be improved.

While the disclosure has been described by way of example and in terms of the preferred embodiments, it is to be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

The invention claimed is:

1. A method of forming a semiconductor structure, comprising:
providing a substrate with a first melting point;
forming a sacrificial layer with a second melting point over the substrate, wherein the second melting point is less than the first melting point;
forming a stack of semiconductor layers over the sacrificial layer, wherein the stack of semiconductor layers has a third melting point greater than the second melting point and a formation temperature less than the second melting point;
stripping the substrate from the stack of semiconductor layers by melting the sacrificial layer through performing a thermal process at a temperature greater than the second melting point and less than the first melting point and the third melting point;
forming a protective layer over the sacrificial layer prior to the formation of the stack of semiconductor layers; and
removing the protective layer after performing the thermal process.

2. The method as claimed in claim 1, wherein the protective layer has a fourth melting point greater than the second melting point or equal to the first melting point.

3. The method as claimed in claim 2, wherein the fourth melting point is less than the third melting point.

4. The method as claimed in claim 1, wherein the protective layer is formed of silicon.

5. The method as claimed in claim 1, wherein the protective layer has a thickness that is not greater than 10 μm.

6. The method as claimed in claim 1, wherein the protective layer is removed by a wet etching process or a polishing process.

7. A method of forming a group-III film structure, comprising:
providing a silicon substrate;
forming a sacrificial layer over the substrate, wherein the sacrificial layer has a melting point less than that of the silicon substrate;
forming a silicon layer over the sacrificial layer;
forming a stack of group-III nitride layers over the silicon layer, wherein the stack of group-III nitride layers has a melting point greater than that of the sacrificial layer and a formation temperature less than that of the sacrificial layer; and stripping the silicon substrate from the stack of group-III nitride layers by melting the sacrificial layer through performing a thermal process at a temperature greater than the melting point of the sacrificial layer and less than the melting point of the silicon substrate and the melting point of the stack of group-III nitride layers.

8. The method as claimed in claim 7, wherein the sacrificial layer is formed of silicon-germanium ($Si_{1-x}Ge_x$).

9. The method as claimed in claim 8, wherein a weight percent (x %) of germanium in the sacrificial layer is in a range of about 1% to 99%.

10. The method as claimed in claim 7, wherein the silicon layer has a thickness that is not greater than 10 μm.

11. The method as claimed in claim 7, further comprising: removing the silicon layer after performing the thermal process.

12. The method as claimed in claim 11, wherein the silicon layer is removed by a wet etching process or a polishing process.

13. The method as claimed in claim 7, further comprising:
forming an insulating layer between the sacrificial layer and the silicon layer; and
patterning the silicon layer to expose portions of the insulating layer.

14. The method as claimed in claim 13, wherein the stack of group-III nitride layers is formed by selective epitaxial growth.

* * * * *